United States Patent [19]

Handy

[11] Patent Number: 4,631,739
[45] Date of Patent: Dec. 23, 1986

[54] HIGH DYNAMIC RANGE CHARGE AMPLIFIER

[75] Inventor: Roland J. Handy, Northridge, Calif.

[73] Assignee: Xerox Corporation, Stamford, Conn.

[21] Appl. No.: 675,599

[22] Filed: Nov. 28, 1984

[51] Int. Cl.⁴ ............................................. H03F 3/04
[52] U.S. Cl. ..................................... 377/60; 357/24; 377/62; 377/63
[58] Field of Search ................................. 377/60–63; 357/24 R

[56] References Cited

U.S. PATENT DOCUMENTS

| 4,047,051 | 9/1977 | Heller | 377/60 X |
| 4,246,496 | 1/1981 | Heller | 377/62 |
| 4,272,693 | 6/1981 | Meusburger | 377/60 X |
| 4,302,685 | 11/1981 | Hebenstreit | 377/62 |
| 4,349,749 | 9/1982 | Pfleiderer et al. | 377/61 |
| 4,454,435 | 6/1984 | Burns | 377/60 X |
| 4,458,324 | 7/1984 | Burke et al. | 357/24 X |
| 4,486,893 | 12/1984 | Carrison | 377/62 X |

Primary Examiner—Stanley D. Miller
Assistant Examiner—D. R. Hudspeth
Attorney, Agent, or Firm—Franklyn C. Weiss

[57] ABSTRACT

A charge coupled device (CCD) amplifier is utilized for amplification of charge packets as small as 500 electrons into usable signals. Very little noise is injected into the signal. The charge amplifier consists of two connecting electrodes, one designated as the detector $G_1$ and the other designated as the response $G_2$, physically separated by any convenient distance on the same LSI chip surface on which an NMOS field effect transistor (FET) is attached. Also coupled to the FET is another electrode $G_3$ designated as the amplifier gate. The charge amplifier structure is embedded in the silicon dioxide layer, with the detector response, and amplifier electrode being located some convenient distance above the silicon-silicon dioxide interface.

1 Claim, 1 Drawing Figure

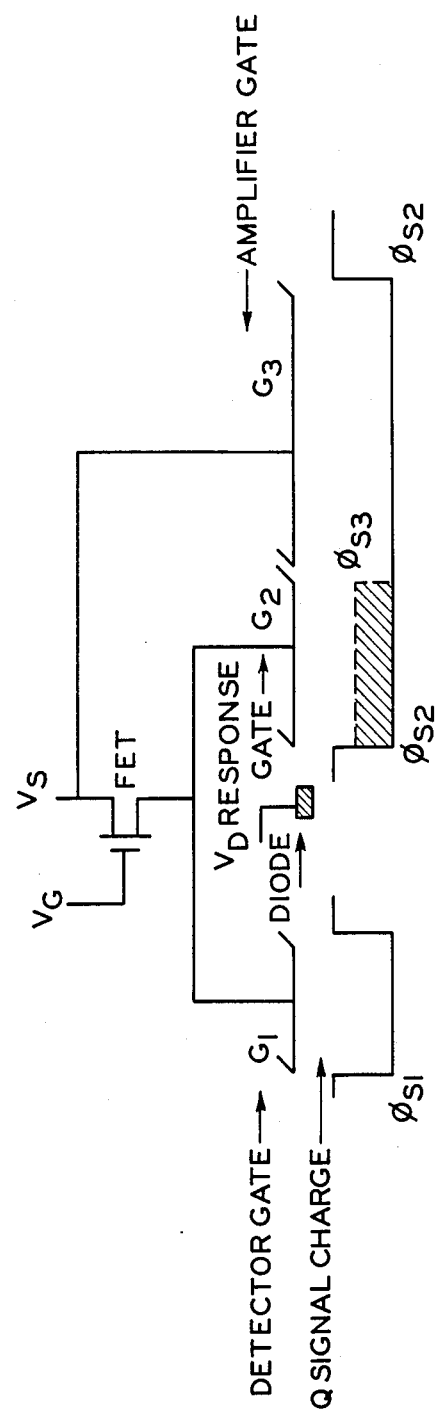

HIGH DYNAMIC RANGE CHARGE AMPLIFIER

This invention relates to a high dynamic range charge amplifier which permits the sensing of low quantities of charge, 500 electrons or less, in low light level imaging systems.

BACKGROUND OF THE INVENTION

Charge coupled devices are well known for their use in light detection in imaging systems. Arrays of charge coupled devices (CCDs) have been utilized for scanning in a raster scan type of arrangement or in a two dimensional array for use in television scanning, for example. The limiting factor for the use of charge coupled devices in imaging system is its low level light detection capability. In order to fully utilize the capability of a charge coupled device, rather than prior art vacuum tube or other kinds of photodetectors, the device must be capable of low level light detection and amplification.

According to the present invention, a charge coupled device (CCD) amplifier is utilized for amplification of charge packets as small as 500 electrons into usable signals. The disclosed process contributes very little noise to the signal. The charge amplifier consists of two connecting electrodes, one designated as the detector and the other designated as the response, physically separated by any convenient distance on which an NMOS field effect transistor (FET) is attached. Also coupled to the FET transistor is another electrode designated as the amplifier gate. The charge amplifier structure is embedded in the silicon dioxide layer, with the detector, response, amlifier electrodes and the NMOS (FET) Transistor being located some convenient distance above the silicon-silicon dioxide interface on the same LSI chip surface and becomes an integral part of the LSI amplifier design.

DESCRIPTION OF THE DRAWINGS

For a more complete understanding of the invention, reference may be had to the following detailed description of the invention in conjunction with the drawings wherein:

The FIGURE is a cross sectional view of an integrated circuit charge amplifier in accordance with the principles of the present invention.

DETAILED DESCRIPTION OF THE INVENTION

A CCD amplifier is disclosed for amplification of charge packets as small as 500 electrons into usable signals. This process contributes very little noise to the process.

As set forth herein, the CCD amplifier detects and measures signal charge in one site and utilizes this information to control a larger amount of charge to be generated at another location. In its simplest (discrete) form the charge amplifier consists of two connecting electrodes, one designated the detector $G_1$ and the other the response $G_2$, physically separated on the same LSI chip by any convenient distance on which an NMOS field effect transistor (FET) is attached. Also attached to the FET transistor is another electrode designated the amplifier gate $G_3$. The charge amplifier structure is embedded in the silicon dioxide layer of the LSI chip, with the detector, response and amplifier electrodes being located some convenient distance above the silicon-silicon dioxide interface.

A cross-sectional view of the charge amplifier is shown schematically in the FIGURE in which the surface depletion regions under the detector, response, and amplifier gates are shown without signal charge.

The operation of the charge amplifier is as follows. At time $T_o$, gate voltage $V_G$ is applied to the gate electrode of the FET; its polarity turns the FET on, applying the voltage $V_S$ to the charge amplifier gates $G_1$, $G_2$. Gate $G_3$ is always held at the voltage $V_S$. At time $T_1$, $(T_1 = T_o + \Delta T)$, the FET is turned off by removing voltage $V_G$. The charge amplifier gates $G_1$ and $G_2$ are now floating and charged to a potential $V_S$ producing the surface potentials $\phi_{S1}$ and $\phi_{S2}$ under the gates $G_1$ and $G_2$, the detector and response gates respectively. If required, $\phi_{S1}$ and $\phi_{S2}$ could be made equal to each other.

Since signal charge Q is only allowed to be dumped under the detector gate, the detector gate $G_1$ will detect the presence of this signal charge Q, and transmit this information to the response gate $G_2$ through the common connection. The surface potential $\phi_{S2}$ under the response gate $G_2$ varies its value (position) as a function of the amount of signal charge Q being dumped under the detector gate $G_1$. This is accomplished in the following way. As signal charge Q is dumped under the detector gate $G_1$, it changes the surface potential $\phi_{S1}$ to a new level, which in turn changes the potential on the charge amplifier response gate $G_2$ from its floating voltage $V_S$ to a value $V_G$, which in turn varies the surface potential $\phi_{S2}$ under the respnse gate $G_2$ from $\phi_{S2}$ to $\phi_{S3}$ which is always void of charge. If no signal charge Q is dumped under the detector Gate $G_1$ no change in the $V_S$ potential will occur and the surface potential $\phi_{S2}$ under the response gate remains constant. The diode voltage $V_o > V_S$ during this time interval is now pulsed to a new value $V_o < V_S$ such that charge from the diode is injected under the $G_2$ and $G_3$ gates flooding this region with charge. The diode voltage is then pulsed back to the original value $V_o > V_S$. When this happens, all the charge is spilled back to the diode except that charge residing under amplifier gate $G_3$, which is a function of the potential barrier generated under gate $G_2$ ($\phi_{S3} - \phi_{S2}$) and the area of gate $G_3$. The value of the charge under gate $G_3$ can be made $n(n>1)$ times as large as the signal charge Q. This charge (nQ) can now be used to drive output circuits and can be made large enough so that large dynamic range sysems can be designed with low input signal constraints.

Charge Q, applied to detector gate $G_1$, could be the signal charge generated when light is impinged upon a photosite or other photosensitive sight which creates charge as an information signal. A CCD pixel site is a typical charge Q generator, which could be in close proximity, on the same LSI chip, to the detector gate $G_1$. If there were a plurality of CCD photosites, there could also be a plurality of the charge amplifiers, as described herein, one for each photosite. Alternatively, one charge amplifier could be used at the end of a shift register which has received charge Qs from a CCD imaging array.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A high dynamic range charge amplifier integrated circuit which permits the sensing and amplifying of low quantities of charge, wherein the improvement comprises:

a first detector gate means ($G_1$) on said integrated circuit, a second response gate means ($G_2$) on said integrated circuit in spaced proximity to said first gate means ($G_1$), means on said integrated circuit for electrically connecting said first and second gate means together, field effect transistor means coupled to a supply voltage ($V_S$) and said electrical connecting means, said field effect transistor means applying said supply voltage ($V_S$) to said electrical connecting means and thus said first and second gate means, when said field effect transistor means is enabled by a gate voltage ($V_G$), and said first and second gate means floating at said supply voltage ($V_S$) when said gate voltage ($V_G$) is removed, a source of charge (Q) to be amplified deposited beneath said first gate means ($G_1$), such that the supply voltage ($V_S$) floating on said first gate means ($G_1$) is affected by the change in surface potential ($\phi_{S1}$) beneath said first gate means ($G_1$), the voltage on said second gate means ($G_2$) being affected, thereby varying the surface potential ($\phi_{S2}$) beneath said second gate means ($G_2$), a third amplifier gate means ($G_3$) in close proximity to said second gate means ($G_2$) and connected to said supply voltage ($V_S$) and directly affected by said surface potential ($\phi_{S2}$) beneath said second gate means ($G_2$), said third gate means ($G_3$) defining a larger area wherein additional charge can be deposited beneath both said second and third gate means ($G_2$, $G_3$) in direct proportion to the amount of charge (Q) deposited beneath said first gate means ($G_1$), and diode means between said first gate means ($G_1$) and said second gate means ($G_2$) for injecting charge beneath said second and third gate means ($G_2$, $G_3$), and then to subsequently dissipate all charge over that determined by the original surface potential ($\phi_{S2}$) and the affected surface potential ($\phi_{S3}$).

* * * * *